United States Patent [19]

Green et al.

[11] 4,416,975

[45] Nov. 22, 1983

[54] PHOTOPOLYMERIZATION PROCESS EMPLOYING COMPOUNDS CONTAINING ACRYLOYL GROUPS AND MALEIMIDE GROUPS

[75] Inventors: George E. Green, Stapleford, England; Ewald Losert, Rheinfelden, Switzerland; John G. Paul, Stirlingshire, Scotland; Hans Zweifel, Basel, Switzerland

[73] Assignee: Ciba-Geigy Corporation, Ardsley, N.Y.

[21] Appl. No.: 361,702

[22] Filed: Mar. 25, 1982

[30] Foreign Application Priority Data

Feb. 4, 1981 [GB] United Kingdom ............... 8110402

[51] Int. Cl.$^3$ ............................................. G03C 5/00
[52] U.S. Cl. .................................. 430/327; 430/270; 430/328; 430/394; 204/159.14; 204/159.22
[58] Field of Search ............... 430/281, 327, 328, 270, 430/394; 204/159.14, 159.22

[56] References Cited

U.S. PATENT DOCUMENTS 3,622,321 11/1971 Smets et al. .
4,079,041 3/1978 Baumann et al. .
4,107,174 8/1978 Baumann et al. .
4,158,730 6/1979 Baumann et al. .
4,158,731 6/1979 Baumann et al. .
4,163,097 7/1979 Baumann et al. .
4,172,836 10/1979 Baumann et al. .
4,174,326 11/1979 Baumann et al. .
4,193,927 3/1980 Baumann et al. .
4,291,118 9/1981 Boduch et al. .
4,302,522 11/1981 Garnett et al. .

FOREIGN PATENT DOCUMENTS 2050378 1/1981 United Kingdom .

OTHER PUBLICATIONS

Derwent CPI 04081 D/04.
Derwent CPI 80296 Y/45.
Derwent CPI 83654 Y/47.

Primary Examiner—Jack P. Brammer
Attorney, Agent, or Firm—Luther A. R. Hall

[57] ABSTRACT

In a three stage process, a layer of a liquid composition containing a compound (A) having in the same molecule at least one (meth)acryloyl group and at least one 2,3-disubstituted maleimido group is exposed to actinic radiation so that the layer solidifies due to photopolymerization of (A) through the (meth)acryloyl group(s), remaining, however, further photocrosslinkable. When desired, the solidified layer is exposed, as through a negative, to a substantially greater amount of actinic radiation, the parts so further exposed becoming more highly photocrosslinked through the disubstituted maleimido group(s) and hence insoluble. An image is produced which can be developed by means of suitable solvents. Examples of (A) include N-(2-(acryloyloxy)ethyl)-2,3-dimethylmaleimide and N-(3-(methacryloyloxy)-2-hydroxypropyl)-2,3-dimethylmaleimide.

20 Claims, No Drawings

PHOTOPOLYMERIZATION PROCESS EMPLOYING COMPOUNDS CONTAINING ACRYLOYL GROUPS AND MALEIMIDE GROUPS

BACKGROUND OF THE INVENTION

This invention relates to a photopolymerisation and photocrosslinking process, and in particular to such a process for the production of images.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development."

It would be desirable to have a process in which a layer of a photopolymerisable substance were applied to a support and this layer were converted into a substantially solid, nontacky state ready for irradiation, without the use of organic solvents. Not only would, in this stage, the use be avoided of solvents which might present problems of toxicity and flammability and also cause expense in their recovery, but the production on a continuous basis of coated supports, ready for irradiation, would be facilitated.

We have found that this object can be achieved by the use of certain substances which contain in the molecule two kinds of groups through which photopolymerisation can occur at rates which differ considerably from one another. The groups are chosen so that photopolymerisation of a layer of a liquid composition occurs rapidly to form a solid, essentially tack-free layer, which is, however, still soluble in certain solvents. When desired, parts of the layer are further subjected to a substantially greater amount of actinic radiation and photocrosslinking takes place through the other type of group in the already photopolymerised molecules of the layer, the parts of the layer which undergo photocrosslinking becoming much more resistant to solution in the solvents.

Unpublished experiments by the applicants have shown that numerous potentially useful compounds, containing two types of units normally capable of undergoing photopolymerisation, do not give satisfactory results in such a process, photopolymerisation in the first stage being much retarded, apparently as a consequence of the presence in the molecule of another type of photopolymerisable unit, despite the incorporation of a variety of photoinitiators and photosensitisers. In other unpublished experiments of the applicants, mixtures of two compounds, one containing a unit normally capable of undergoing photopolymerisation and the other having a different unit normally capable of undergoing photocrosslinking, gave unsatisfactory results, apparently due to inhibition of the photocrosslinking reaction.

It has been found that the desired process can be achieved by employing a compound which contains in the same molecule both one or more acryloyl or methacryloyl groups and one or more 2,3-disubstituted maleimide groups.

SUMMARY OF THE INVENTION

One aspect of this invention accordingly provides a process for production of an image which comprises (1) exposing to actinic radiation a layer, supported on a carrier, of a liquid composition containing a compound (A) having in the same molecule both at least one group of formula

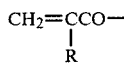

and at least one group of formula

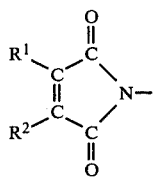

such that the layer solidifies and becomes essentially nontacky due to photopolymerisation of (A) through the group or groups of formula I but remains substantially photocrosslinkable, and subsequently, when desired, (2) exposing through an image-bearing transparency consisting of substantially opaque and substantially transparent parts the layer so solidified to a substantially greater amount of actinic radiation such that the further exposed part or parts of the photopolymerized layer undergo photocrosslinking through the group or groups of formula II, and (3) developing the image by dissolving in a solvent the part or parts of the layer which have not become photocrosslinked, where R denotes a hydrogen atom or a methyl group and $R^1$ and $R^2$ each denote the same or different alkyl group of 1 to 4 carbon atoms or together they denote a trimethylene or tetramethylene group which may be optionally substituted by a methyl group.

British Patent Specification No. 1 544 840 describes the preparation of numerous compounds containing 2,3-disubstituted maleimide units, particularly 2,3-dimethylmaleimido units, including some which also contain acryloyl or methacryloyl groups. British Patent Specification No. 1 544 299 describes polymers containing 2,3-disubstituted maleimide units which can be crosslinked by means of actinic radiation. In the latter Specification it is stated that monomers which contain, in addition to the double bond present in the 2,3-disubstituted maleimido radical of formula II, a further ethylenically unsaturated double bond which can be polymerised more easily than the 2,3-disubstituted maleimido radical of formula II, can be polymerised by means of free radical initiators in such a way that polymers are obtained which do not have a crosslinked structure, which contain the 2,3-disubstituted maleimido groups of formula II as side substituents, and which can subsequently be crosslinked by means of electromagnetic irradiation. Thus, in Examples, N-(3-(acryloyloxy)-propyl)-2,3-dimethylmaleimide, together with methyl methacrylate, glycidyl methacrylate, ethyl acrylate, or 2-hydroxyethyl acrylate, was polymerised by means of benzoyl peroxide or 2,2'-azobis(2-methylpropionitrile). That the vinyl polymerisations were all effected using chemical free radical initiators suggests that the vinyl polymerisations to obtain polymers containing 2,3-disubstituted maleimido groups which are still photopolymerisable could not be carried out using actinic radiation. There is no indication that a compound having groups of formula I and formula II could be polymerised by a first exposure to actinic radiation to give a polymeric material whose solubility is sufficiently different from that of the product obtained by further exposure of the polymeric material to actinic radiation that it can be used as a photoresist in an image-forming process.

In a recently published U.S. Pat. No. 4,291,118 there is described a method for relief imaging a liquid polymeric composition, in which a layer of the composition is subjected to a first polymerisation treatment by exposure to actinic radiation, chemical hardening occurring sufficient to solidify the layer, then the solidified mass is further treated with polymerising actinic radiation in a pattern, such that the solidified mass in the pattern is in a different chemical condition from that not in the pattern, and finally the portion solidified only by the first exposure to actinic radiation is selectively removed, such as by a solvent, to leave as a relief image the portion of the solidified mass which had been subjected to the further polymerising actinic radiation.

The only polymeric compositions named are conventional polyene-polythiol mixtures and in the Example such a mixture which is described as being commercially available is employed. There is no suggestion of using a compound containing two chemically different groups through which photopolymerisation and subsequently crosslinking could be achieved.

DETAILED DISCLOSURE

Usually the compound (A) employed in the process of this invention will contain, per average molecule, up to four groups of formula I and up to four groups of formula II. Preferably it has a molecular weight of at most 2,000. Preferably the group or groups of formula I, and preferably also the group or groups of formula II, are each directly attached to an atom or atoms or carbon, oxygen, or nitrogen; particularly preferred are compounds in which $R^1$ and $R^2$ in formula II each denote a methyl group.

Compounds suitable for use as (A) may be obtained by reaction, simultaneously or in either order, of a compound having two or more glycidyl groups directly attached to an atom or atoms of oxygen, nitrogen, or sulphur with acrylic or methacrylic acid and with a 2,3-disubstituted maleimido-carboxylic acid of formula

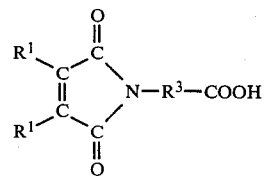

III where $R^1$ and $R^2$ have the meanings assigned in formula II and $R^3$ denotes a divalent residue, after removal of a primary amino group and a carboxyl group, of a compound containing at least one said amino group and at least one carboxyl group, preferably an aliphatic, cycloaliphatic, aromatic, araliphatic, or heterocyclic residue of 1 to 12 carbon atoms.

There may thus be used as compound (A) substances of the general formula

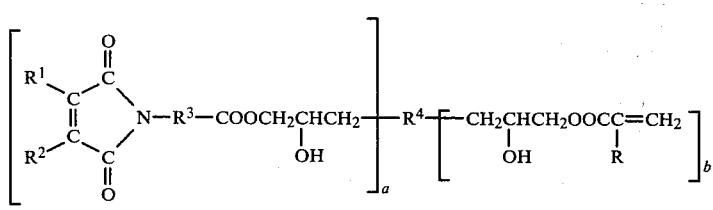

IV where a and b are each independently an integer of at least 1 and preferably at most 4, R has the meaning assigned in formula I, $R^1$ and $R^2$ have the meanings assigned in formula II, $R^3$ has the meaning assigned in formula III, and $R^4$ denotes the residue, after removal of (a+b) glycidyl groups directly attached to an atom or atoms of oxygen, nitrogen, or sulphur, of a compound containing at least (a+b) such glycidyl groups.

It will be appreciated that the product will also contain adducts formed from the compound having two or more glycidyl groups and from acrylic acid or methacrylic acid only, or from the compound containing two or more glycidyl groups and from the 2,3-disubstituted maleimido-carboxylic acid only, i.e., compounds of formula

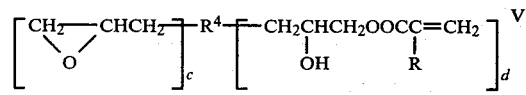

V and compounds of formula

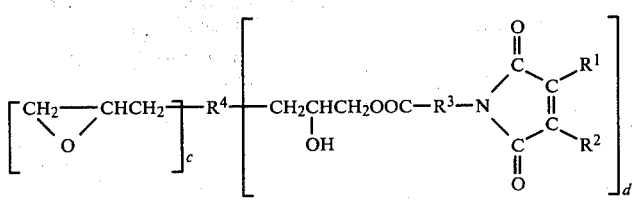

VI where
c represents zero or a positive integer,
d is an integer of at least one, the sum of (c+d) being the same as the sum of (a+b),
R has the meaning assigned in formula I,
$R^1$ and $R^2$ have the meanings assigned in formula II,
$R^3$ has the meaning assigned in formula III, and
$R^4$ has the meaning assigned in formula IV.

The extent of formation of the byproducts of formula V or VI will depend, of course, on the proportions of the three types of reactants employed. In general, the presence of such byproducts does not interfere with the carrying out of the process of this invention.

Carboxylic acids of formula III are obtainable by reaction of a 2,3-disubstituted maleic anhydride with an aminoacid of formula $H_2NR^3COOH$ as described in the aforementioned British Patent Specification No. 1 544 840. $R^3$ may represent, by way of example, a p-phenylene, methylene, ethylene, pentamethylene, or ethylidene group.

Substances suitable for use as compound (A) may be obtained similarly, using in place of the carboxylic acid of formula III a 2,3-disubstituted maleimidophenol of formula VIII

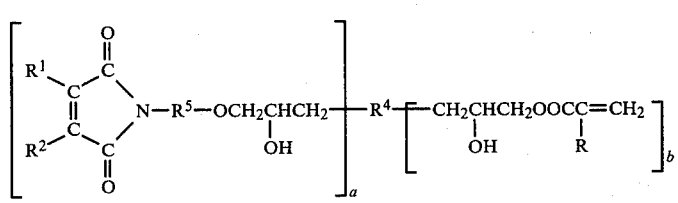

VIII where
R has the meaning assigned in formula I,
$R^1$ and $R^2$ have the meanings assigned in formula II,
$R^4$ has the meaning assigned in formula IV,
$R^5$ has the meaning assigned in formula VII, and
a and b have the meanings assigned in formula IV.

Phenols of formula VII are obtainable by reaction of a 2,3-disubstituted maleic anhydride with an aminophenol of formula $H_2NR^5OH$ as described in the aforementioned British Patent Specification No. 1 544 840. $R^5$ may represent, by way of example, an o—, m—, or p-phenylene group.

Likewise, the product will also contain adducts formed from the compound having two or more glycidyl groups and from acrylic or methacrylic acid only, or from the compound having two or more glycidyl groups and from the 2,3-disubstituted maleimido-phenol only, i.e., compounds of formula V and compounds of formula

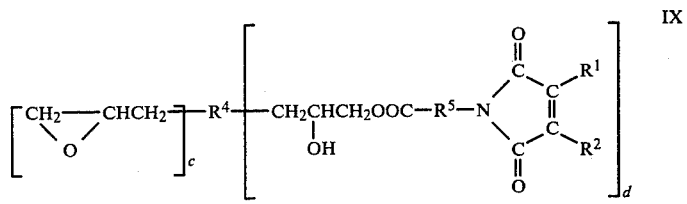

IX where
$R^1$ and $R^2$ have the meanings assigned in formula II,
$R^3$ has the meaning assigned in formula III,
$R^4$ has the meaning assigned in formula IV,
$R^5$ has the meaning assigned in formula VII, and
c and d have the meanings assigned in formulae V and VI, their proportions depending on the ratio of the three types of reactant employed. These byproducts similarly do not, in general, interfere with the carrying out of the process.

As examples of compounds containing glycidyl groups which may be treated with acrylic acid or methacrylic acid and with a 2,3-disubstituted maleimidocarboxylic acid of formula III or a 2,3-disubstituted

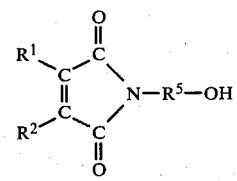

VII where
$R^1$ and $R^2$ has the meanings assigned in formula II and
$R^5$ denotes the divalent residue, after removal of a primary amino group and a phenolic hydroxyl group, of a compound containing at least one said amino group and at least one said hydroxyl group, preferably an aromatic residue of 6 to 18 carbon atoms,
together with acrylic acid or methacrylic acid.

There may accordingly be used compounds of the formula maleimidophenol of formula VII may be mentioned polyglycidyl esters obtainable by reaction of a compound containing two or more carboxylic acid groups per molecule with epichlorohydrin or with glycerol dichlorohydrin in the presence of an alkali. Such polyglycidyl esters may be derived from aliphatic polycarboxylic acids, e.g., succinic acid, glutaric acid, adipic acid, pimelic acid, suberic acid, azelaic acid, sebacic acid, or dimerised or trimerised linoleic acid; from cycloaliphatic polycarboxylic acids such as tetrahydrophthalic acid, 4-methyltetrahydrophthalic acid, hexahydrophthalic acid, and 4-methylhexahydrophthalic acid, and from aromatic polycarboxylic acids such as phthalic acid, isophthalic acid, and terephthalic acid. Other suitable polyglycidyl esters are obtainable by polymerisation of glycidyl esters of vinylic acids, especially glycidyl acrylate and glycidyl methacrylate.

Further examples are polyglycidyl ethers obtainable by reaction of a compound containing at least two free alcoholic hydroxyl and/or phenolic hydroxyl groups per molecule with epichlorohydrin under alkaline conditions or, alternatively, in the presence of an acidic catalyst and subsequent treatment with alkali. These ethers may be made from acyclic alcohols such as ethylene glycol, diethylene glycol, and higher poly(oxyethylene) glycols, propane-1,2-diol and poly(oxypropylene) glycols, propane-1,3-diol, poly(oxytetramethylene) glycols, pentane-1,5-diol, hexane-2,4,6-triol, glycerol, 1,1,1-trimethylolpropane, pentaerythritol, sorbitol, and polyepichlorohydrins; from cycloaliphatic alcohols such as resorcitol, quinitol, bis(4-hydroxycyclohexyl)methane, 2,2-bis(4-hydroxycyclohexyl)propane, and 1,1-bis(hydroxymethyl)cyclohex-3-ene; and from alcohols having aromatic nuclei, such as N,N-bis(2-hydroxyethyl)aniline and p,p'-bis(2-hydroxyethylamino)diphenylmethane. Or they may be made from mononuclear phenols, such as resorcinol and hydroquinone, and from polynuclear phenols, such as bis(4-hydroxyphenyl)methane (otherwise known as bisphenol F), 4,4'-dihydroxydiphenyl, bis(4-hydroxyphenyl) sulphone, 1,1,2,2-tetrakis(4-hydroxyphenyl)ethane, 2,2-bis(4-hydroxyphenyl)propane (otherwise known as bisphenol A), 2,2-bis(3,5-dibromo-4-hydroxyphenyl)propane, and novolaks formed from aldehydes such as formaldehyde, acetaldehyde, chloral, and furfuraldehyde, with phenol itself, and phenol substituted in the ring by chlorine atoms or by alkyl groups each containing up to nine carbon atoms, such as 4-chlorophenol, 2-methylphenol, and 4-tert.-butylphenol.

Poly(N-glycidyl) compounds may also be used, e.g., N-glycidyl derivatives of amines such as aniline, n-butylamine, bis(4-aminophenyl)methane, and bis(4-methylaminophenyl)methane; triglycidyl isocyanurate; and N,N'-diglycidyl derivatives of cyclic alkylene ureas, such as ethyleneurea and 1,3-propyleneurea, and of hydantoins such as 5,5-dimethylhydantoin.

Poly(S-glycidyl) compounds may also be used, e.g., di(S-glycidyl) derivatives of dithiols such as ethane-1,2-dithiol and bis(4-mercaptomethylphenyl) ether, but they are not preferred.

Polyepoxides having the 1,2-epoxide groups attached to different kinds of hetero atoms may be employed, e.g., the glycidyl ether-glycidyl ester of salicylic acid, or p-(diglycidylamino)phenyl glycidyl ether.

Most preferably $R^4$ represents the divalent residue of a polyglycidyl ether, which may have been advanced, of a polyhydric phenol or of a polyhydric aliphatic alcohol.

Compounds suitable for use as component (A) may also be obtained by reaction of a compound containing two or more alcoholic hydroxyl groups with acryloyl or methacryloyl chloride and with a 2,3-disubstituted maleimido-acid chloride of formula

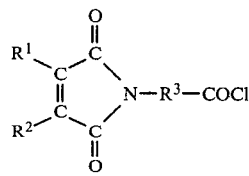

X where
$R^1$ and $R^2$ have the meanings assigned in formula II and
$R^3$ has the meaning assigned in formula III.

There may accordingly be used compounds of the formula

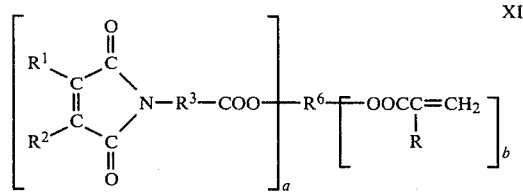

XI where
a and b have the meaning assigned in formula IV,
R has the meaning assigned in formula I,
$R^1$ and $R^2$ have the meanings assigned in formula II,
$R^3$ has the meaning assigned in formula III, and
$R^6$ denotes the residue, after removal of (a+b) alcoholic hydroxyl groups, of an alcohol having at least (a+b) said hydroxyl groups.

Preferably $R^6$ denotes an aliphatic residue comprising repeating units of formula

XII where m represents 2, 3, or 4,

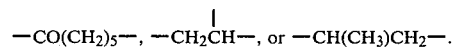

Thus, $R^6$ may, for example, represent the residue of a poly(oxyethylene) glycol or poly(oxypropylene) glycol of average molecular weight 250 to 5000, or the residue of a polyvinyl alcohol of average molecular weight 500 to 9000.

Means of preparing acid chlorides of formula X are described in the British Patent Specification No. 1 544 840 already mentioned.

It will be understood that there will similarly be formed byproducts of formula

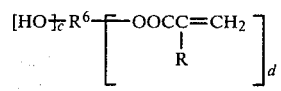

XIII and byproducts of formula

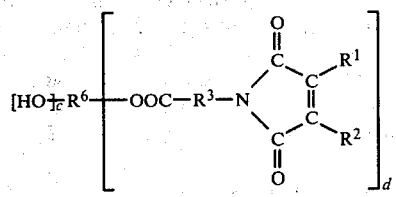

where
e and d have the meanings assigned in formulae V and VI,
$R^1$ and $R^2$ have the meanings assigned in formula II,
$R^3$ has the meaning assigned in formula III, and
$R^6$ has the meaning assigned in formula XI.
They do not, however, interfere with the process.

Other compounds suitable for use as component (A) are of the general formula

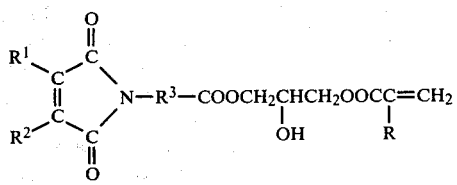

or of the general formula

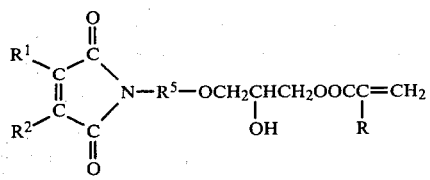

where
R has the meaning assigned in formula I,
$R^1$ and $R^2$ have the meanings assigned in formula II,
$R^3$ has the meaning assigned in formula III, and
$R^5$ has the meaning assigned in formula VII.

Compounds of formula XV and XVI may be obtained by reaction of glycidyl acrylate or glycidyl methacrylate with, respectively, a 2,3-disubstituted maleimido-carboxylic acid of formula III and a 2,3-disubstituted maleimido-phenol of formula VII.

Yet further compounds suitable for use as (A) are of the general formula

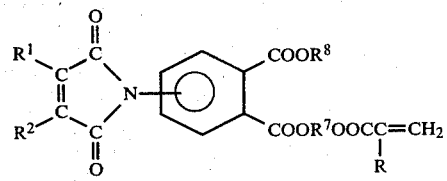

where
R has the meaning assigned in formula I,
$R^1$ and $R^2$ have the meanings assigned in formula II,
$R^7$ denotes an alkylene group of 2 or 3 carbon atoms, and
$R^8$ denotes a hydrogen atom or a group of formula

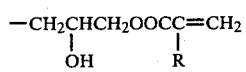

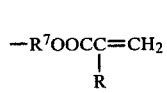

Such compounds where $R^8$ denotes a hydrogen atom may be obtained by reaction of a sodium salt of an aminophthalic acid with a disubstituted maleic anhydride in toluene-water followed by acidification to isolate the 2,3-disubstituted maleimidophthalic acid and dehydration to form the anhydride and then reaction with a hydroxyalkyl acrylate or methacrylate as described in the above-mentioned British Patent Specification No. 1,544,299. Thus, 3-(2,3-dimethylmaleimido)phthalic anhydride may be converted, by means of 2-hydroxyethyl methacrylate, into 2-(5-methyl-3-oxa-4-oxohex-5-enyloxycarbonyl)-6-(2,3-dimethylmaleimido)benzoic acid. Compounds of formula XVII where $R^8$ denotes a group of formula XVIII may be obtained by reaction of glycidyl (meth)acrylate with the acid of formula XVII where $R^8$ denotes a hydrogen atom, and compounds of formula XVII where $R^8$ denotes a group of formula XIX or XX may be obtained by further reaction of that acid with 2-hydroxyethyl or 2-hydroxypropyl (meth)acrylate.

There also come into consideration compounds of the general formula

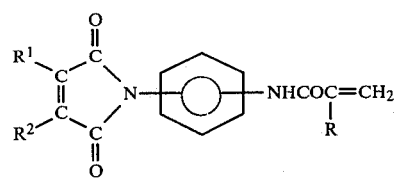

where
R has the meaning assigned in formula I and
$R^1$ and $R^2$ have the meanings assigned in formula II.

Reaction of a phenylenediamine with a disubstituted maleic anhydride can be conducted such as to furnish the mono-substituted imide-amine as disclosed in the above-mentioned British Patent Specification No. 1,544,840, which imide-amine may then be treated with (meth)acryloyl chloride in a conventional manner to form an imide-amide of formula XX.

Amide-imides, which may also be used, of the general formula

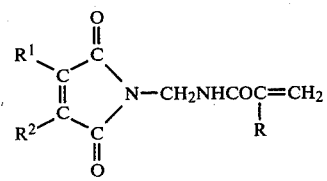

where
R has the meaning assigned in formula I and
$R^1$ and $R^2$ have the meanings assigned in formula II, may be obtained by conversion of a 2,3-disubstituted maleimide into its N-hydroxymethyl derivative with formaldehyde followed by reaction with (meth)acrylamide or by reaction of a 2,3-disubstituted maleimide with N-hydroxymethyl- or N-methoxymethyl(meth)acrylamide.

Compounds of the general formula

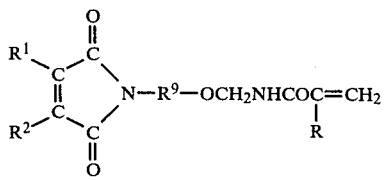   XXII where

R has the meaning assigned in formula I,

R¹ and R² have the meanings assigned in formula II, and

R⁹ denotes a divalent residue, after removal of a primary amino group and an alcoholic hydroxyl group, of a compound containing at least one said amino group and at least one said hydroxyl group, preferably an aliphatic residue of 2 to 6 carbon atoms or a cycloaliphatic residue of 6 to 8 carbon atoms, which may also be employed, may be made by reaction of a disubstituted maleimido-alcohol of formula

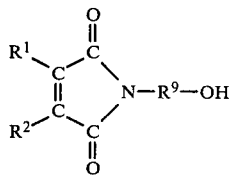   XXIII with N-(hydroxymethyl)acrylamide, N-(hydroxymethyl)methacrylamide, or the corresponding N-(methoxymethyl) compounds.

Compounds of the general formula

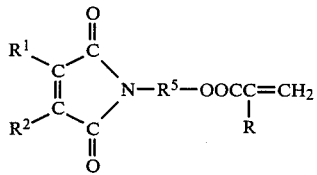   XXIV where

R has the meaning assigned in formula I,

R¹ and R² have the meanings assigned in formula II, and

R⁵ has the meaning assigned in formula VII, which may be made by reaction of a disubstituted maleimidophenol of formula VII with (meth)acryloyl chloride, may also be used.

Preferably (A) is of the general formula

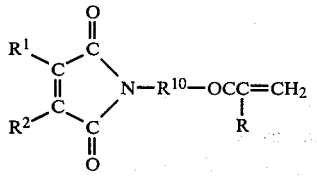   XXV

R has the meaning assigned in formula I,

R¹ and R² have the meanings assigned in formula II, and

R¹⁰ denotes an imino group, an alkylenoxy group of 1 to 10 carbon atoms, a 2-hydroxypropyleneoxy group, a poly(oxyalkylene) group of 4 to 12 carbon atoms, a cycloalkyleneoxy group of 5 to 7 carbon atoms, or an alkylenecarbonamide group of 2 to 10 carbon atoms.

R¹⁰ may represent, for example, an alkylenecarbonamido group of formula —(CH₂)₅CONH—, an alkyleneoxy group of formula —(CH₂)₆O—, a cyclohexyleneoxy group, or a methylcyclohexyleneoxy group; preferably it denotes a group of formula —(CH₂)$_{m-1}$O—, —CH₂CH(CH₃)O—, —CH₂CH(OH)CH₂O—, or    XXVI where m has the meaning assigned in formula XII.

Compounds of formula XXV where R¹⁰ denotes an imino group may be obtained from an N-amino-2,3-disubstituted maleimide by treatment with acryloyl chloride or methacryloyl chloride.

Compounds of formula XXV where R¹⁰ denotes an alkyleneoxy group of at least 2 carbon atoms or a poly(oxyalkylene) group may be obtained by reaction of a 2,3-disubstituted maleic anhydride with an aminoalcohol followed by treatment with acryloyl chloride or methacryloyl chloride, while those where R¹⁰ denotes —CH₂O— may be obtained by conversion of a 2,3-disubstituted maleimide into its N-hydroxymethyl derivative by means of formaldehyde, followed by treatment with (meth)acryloyl chloride. Such compounds where R¹⁰ represents —CH₂CH(OH)CH₂O— may be obtained by reaction of an N-glycidyl-2,3-disubstituted maleimide with acrylic acid or methacrylic acid. Compounds of formula XXV where R¹⁰ denotes a cycloalkeneoxy group may be obtained by reaction of a 2,3-disubstituted maleic anhydride with a cycloaliphatic aminoalcohol followed by treatment with acryloyl chloride or methacryloyl chloride.

Compounds of formula XXV where R¹⁰ denotes an alkylenecarbonamido group may be obtained by reaction of a 2,3-disubstituted maleic anhydride with an amino-substituted aliphatic carboxylic acid to form the N-(carboxyalkylene)-2,3-disubstituted maleimide, conversion into the acid chloride, and reaction with acrylamide or methacrylamide.

Methods of preparation of such compounds (A) are described in the aforementioned British Patent Specification No. 1,544,840.

Specific examples of substances suitable for use as compound (A) are N-(2-(acryloyloxy)ethyl)-2,3-dimethylmaleimide, N-(3-acryloyloxy)-2-hydroxypropyl)-2,3-dimethylmaleimide, N-(3-(acryloyloxy)propyl)-2,3-dimethylmaleimide, the corresponding methacryloyl homologues, N-(2-(2-methacryloyloxy)ethoxy)ethyl)-2,3-dimethylmaleimide, and the 2-(acryloyloxy)ethyl 3-(methacryloyloxy)-2-hydroxypropyl esters of 3- and 4-(2,3-dimethylmaleimido)phthalic acids.

For photopolymerisation through groups of formula I it is greatly preferred that the liquid composition contain an added photoinitiator, i.e., a catalyst which, on irradiation, gives an excited state that leads to formation of free radicals which then initiate polymerisation of (A). Examples of suitable photoinitiators are organic peroxides and hydroperoxides, α-halogen substituted acetophenones such as trichloromethyl 4'-tert. butylphenyl ketone, α-hydroxy-α-alkyl-substituted acetophenones such as 2-hydroxy-2-methyl-1-phenylpropan-1-one, benzoin and its alkyl ethers (e.g., the n-butyl ether), α-methylbenzoin, alkyl α,α-dialkyloxy-α-benzoylacetates, benzophenones such as benzophenone itself and 4,4′-bis(dimethylamino)benzophenone, O-alkoxycarbonyl derivatives of an oxime of benzil or of 1-phenylpropane-1,2-dione, such as benzil (O-ethoxycarbonyl)-α-monoxime and 1-phenylpropane-1,2-dione 2-(O-ethoxycarbonyl)oxime, benzil ketals, e.g., its dimethyl ketal, substituted thioxanthones, e.g., 2-chlorothioxanthone, anthraquinones, esters of phenylglyoxylic acid, 2-benzoyl-2-phenyl-1,3-dioxolanes and 4-benzoyl-4-phenyl-1,3-dioxolanes, and photoredox systems comprising a mixture of a phenothiazine dye (e.g., methylene blue) or a quioxaline (e.g., a metal salt of 2-(m- or p-methoxyphenyl)quinoxaline-6′ or 7′-sulphonic acid) with an electron donor such as benzenesulphinic acid or other sulphinic acid or a salt thereof such as the sodium salt, or an arsine, a phosphine, or thiourea.

Suitable photoinitiators are readily found by routine experimentation. Generally, 0.15 to 10%, and preferably 2.5 to 5%, by weight of the photoinitiator is incorporated, based on the total weight of (A) and any further compound (B) present containing at least one group of formula I but none of formula II. (Substances suitable for use as compound (B) are described below.)

For photocrosslinking through groups of formula II it is also greatly preferred that the liquid composition further contain an added triplet photosensitiser, i.e., a compound which, on irradiation, gives an excited state that transfers the triplet energy to a 2,3-disubstituted maleimide group of formula II which is not excited. It is necessary that the triplet sensitiser display an absorption maximum which permits a light absorption in the range of more than 300 nm which is adequate for practical purposes, and it is also required that the triplet energy transfer be exothermic. Photopolymerised compounds containing the 2,3-disubstituted maleimide group of formula II have a T$_1$ state which lies between 50 and 53 kCal. per mol, hence triplet sensitisers which permit exothermic energy transfer in the range mentioned, that is to say, have a T$_1$ state of at least 50 kCal. per mol. are suitable for sensitising. Examples of suitable sensitisers are benzene, phenol, benzoic acid, benzonitrile, aniline, xanthone, acetophenone, di-isopropyl ketone, diphenyl sulphide, diphenylamine, benzaldehyde, diphenylselenium, carbazole, triphenylamine, hexachlorobenzene, 4,4-diphenylcyclohexadienone, 1,2-dibenzoylbenzene, thiophene, benzophenone, 1,4-diacetylbenzene, fluorene, triphenylene, 4-cyanobenzophenone, diphenyl, thioxanthone, 2-chlorothioxanthone, phenylglyoxal, anthraquinone, quinoline, phenanthrene, flavone, Michler's ketone, naphthalene, 4-acetyldiphenyl, nitrobenzene, 2-acetonaphthene, Acridine yellow, 1-naphthyl phenyl ketone, chrysene, 1-acetonaphthol, 1-naphthaldehyde, diacetyl, coronnene, benzil, fluorenone, fluorescein (acid), p-nitrostilbene, anthrone, benzanthrone, 2-nitrofluorene, quinoxaline and substitution products, 4-nitrodiphenyl, 5-nitroacenaphthene, 4-nitroaniline, naphthothiazoline, and 1-acetylamino-4-nitronaphthalene.

Suitable photosensitisers are likewise readily found by routine experimentation. Generally, 0.1 to 10%, and preferably 0.5 to 7.5%, by weight of the photosensitiser is incorporated, calculated on the total weight of (A) and any other compound (C) present containing at least one group of formula II but none of formula I.

References in this Specification to photocrosslinking through groups of formula II are not to be construed as precluding the possibility that a minor amount of photodimerisation in stage (1) may take place through groups of formula II: it is believed, however, that the great preponderance of photopolymerisation in stage (1) involves only groups of formula I.

As stated above, the composition is applied in a liquid form to a carrier. Conveniently its viscosity is in the range 0.1 to 0.4 Pa s. To meet the requirement that the composition be liquid it may be necessary, in order to achieve this without the use of volatile organic solvents, to include another compound which is a liquid and which photopolymerises under the conditions in stage (1) to form a solid. It is convenient to use for the purpose a photopolymerisable compound (B) having in the molecule at least one group of formula I but none of formula II. Compound (B) may be, for example, an alkyl or hydroxyalkyl ester (which alkyl or hydroxyalkyl group may be substituted) of acrylic acid or methacrylic acid, typically, such esters having up to 15 carbon atoms in all, such as methyl methacrylates, ethyl methacrylate, n-butyl acrylate, and 2-hydroxyethyl acrylate. Also useful for this purpose are 3-alkoxy-2-hydroxypropyl, 3-alkenoxy-2-hydroxypropyl, and 3-aryloxy-2-hydroxypropyl esters of acrylic acid or methacrylic acid, typically, those containing up to 15 carbon atoms in all.

Other kinds of compound (B) may be included in the liquid composition so that some desired property may be imparted to the photopolymerised, photocrosslinked product. Thus, to impart flame-retardant properties the compound (B) may also contain at least one chlorine, bromine, or phosphorus atom. Examples of such are adducts of acrylic acid or methacrylic acid with a bromine- or chlorine-substituted aryl glycidyl ether such as dibromo-p-cresyl glycidyl ether, e.g., 3-(methacryloyloxy)-2-hydroxypropyl X,Y-dibromo-p-cresyl ether.

As is explained below, it may be desirable to introduce epoxide groups into the composition: after the product has been photocrosslinked, additional crosslinking may be achieved by thermal curing through epoxide groups. It may therefore be advantageous to include in the liquid composition a photopolymerisable compound having in the same molecule both a group of formula I and only one 1,2-epoxide group, such as glycidyl acrylate or glycidyl methacrylate. Alternatively, an epoxide resin (i.e., a compound containing more than one epoxide group) may be included in the liquid composition before photopolymerisation.

If desired the liquid composition may likewise contain a photopolymerisable compound (C) having at least one group of formula II but none of I, e.g., N-glycidyl-2,3-dimethylmaleimide.

The liquid composition can be applied to suitable carriers by the customary techniques, such as spray coatings, whirler coating, roller coating, cascade coating, and especially curtain coating. Typically, the carrier is coated such that the layer of the composition is 1 to 250 μm thick. The carrier may be of, for example, copper, aluminium or other metal, paper, synthetic resin, or glass.

In both the photopolymerising and the subsequent photocrosslinking stage of the process of this invention actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The times required for the exposures of the photopolymerisable composition and the still photocrosslinkable composition will depend upon a variety of factors which include, for example, the individual compounds used, the type of light source, and the distance of that source from the irradiated composition. Suitable times may be readily determined by those familiar with photopolymerisation techniques; usually, the amount of light energy required in the second stage (the photocrosslinking stage) is 15 to 100 times that required in the first stage, typically, 25 to 60 times. By way of example, the composition is first irradiated at a distance of 10–25 cm with a 500 watt bulb for 5–15 seconds: in the second stage it is irradiated for 10–20 minutes at a distance of 15–30 cm. With more powerful sources of irradiation, e.g., of 5 kilowatts, the irradiation times, particularly in the second stage, may be much shorter.

The preferred substances for use as compound (A) contain only one group of formula I per molecule, but satisfactory results have been achieved with substances containing more than one such group. Where diacrylates, dimethacrylates and other substances containing more than one group of formula I are used, exposure to actinic radiation in stage (1) should be restricted so that any crosslinking in that stage through groups of formula I does not proceed to an extent such that formation of an image in stage (3) is substantially inhibited.

Suitable solvents for development of the image are readily found by routine testing and include cyclohexanone, trimethylcyclohexanone, 2-ethoxyethanol, 1,1,1-trichloroethane, benzyl alcohol, methylene chloride, and mixtures thereof. The action of the solvent may need to be assisted by agitation or by gentle brushing. Where the carrier has a layer of a suitable electrically-conducting metal, usually copper or silver, immediately in contact with the photopolymerised composition uncrosslinked polymer can be removed by development to expose the metal. Metal so exposed may then be etched away in the non-image areas, so forming a printed circuit, by means of etching fluids such as ferric chloride or ammonium persulphate solutions.

If desired, it is possible to include in the liquid composition a compound (B) which also has at least one free sulphonic or phosphonic acid group, or particularly at least one free carboxylic acid group; conveniently, this is acrylic acid or methacrylic acid or an adduct of a hydroxyalkyl acrylate or methacrylate with trimellitic anhydride, i.e., a compound of formula

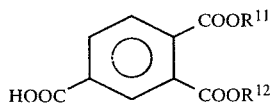

XXVII where either $R^{11}$ denotes a hydrogen atom, in which case $R^{12}$ denotes a group of formula

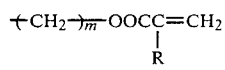

XXVIII or

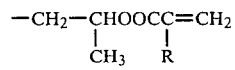

XXIX or $R^{11}$ denotes a group of formula XXVIII or XXIX, in which case $R^{12}$ denotes a hydrogen atom, wherein
R has the meanings assigned in formula I and
m has the meaning assigned in formula XII.

In place of, or as well as, such a compound (B) there may be used a carboxyl-containing compound (A) of formula XVII, where $R^8$ denotes a hydrogen atom.

The presence of free sulphonic, phosphoric, or carboxylic acid groups in the photopolymerised polymer has as a consequence the facility of using an aqueous solution of a base, such as dilute sodium hydroxide, sodium carbonate, disodium hydrogen orthophosphate, or ammonia solutions for development, thus avoiding the use of organic solvents in this stage.

Alternatively, there may be included in the liquid composition a compound (B) which also has at least one primary, secondary, or tertiary amino group. As a consequence of the presence of free amino groups in the photopolymerised polymer, aqueous solutions of acids may be used as the developer, such as dilute solutions of mineral acids. Examples of such compounds (B) are alkyl esters of acrylic or methacrylic acid, which alkyl groups are substituted by a secondary or tertiary amino group, such as 2-(dimethylamino)ethyl methacrylate.

As has already been indicated, the composition after photopolymerisation and photocrosslinking may contain an epoxide resin in which case it may also contain a latent, heat-curing agent for the epoxide resin so that the composition may be heated and supplementary crosslinking occur, further to increase the resistance of the photocrosslinked product to solvents and high temperatures. The epoxide resin may, as already stated, be included as such in the composition or may be formed in situ through photopolymerisation of a compound (B) which also contains in the same molecule only one 1,2-epoxide group. Examples of latent, heat-curing agents for epoxide resins are polycarboxylic acid anhydrides, such as hexahydrophthalic anhydride, dicyandiamide, complexes of amines such as ethylamine, trimethylamine, and n-octyldimethylamine with boron trifluoride or with boron trichloride, latent boron difluoride chelates, aromatic polyamines such as bis(p-aminophenyl)methane and bis(p-aminophenyl) sulphone, aromatic biguanides such as 2,6-xylidene biguanide, and imidazoles such as 2-ethyl-4-methylimidazole and 2-phenylimidazole.

The following Examples illustrate the invention. Unless otherwise indicated, parts and percentages are by weight. Substances used in the Examples were prepared as follows:

N-(2-Acryloyloxy)ethyl)-2,3-dimethylmaleimide

N-(2-(Methacryloyloxy)ethyl)-2,3-dimethylmaleimide

These were prepared from N-(2-hydroxyethyl)-2,3-dimethylmaleimide and acryloyl or methacryloyl chloride analogously to the method described for the preparation of the 3-(methacryloyloxy)propyl homologue in Example 17 of British Patent Specification No. 1,544,840.

N-(2-(2-(Methacryloyloxy)ethoxy)ethyl)-2,3-dimethylmaleimide

This was obtained by reaction of 2,3-dimethylmaleic anhydride with 2-(2-hydroxyethoxy)ethylamine and esterification of the resultant N-(2-(2-hydroxyethoxy)ethyl)-2,3,dimethylmaleimide with methacryloyl chloride.

2-(Acryloyloxy)ethyl 3-(methacryloyloxy)-2-hydroxypropyl X-(2,3-dimethylmaleimido)phthalates To a mixture of 3- and 4-(2,3-dimethylmaleimido)phthalic anhydride (54.2 g), 2-hydroxyethyl acrylate (26 g), and tetrahydrofuran (500 ml) were added triethylamine (1 ml) and hydroquinone (0.2 g), and the mixture was heated at 50° C. under nitrogen with stirring for 24 hours. Then glycidyl methacrylate (28.4 g) was added dropwise over 1 hour, and heating with stirring at 50° C. was continued for a further 24 hours. The tetrahydrofuran was removed by distillation on a water bath under reduced pressure, the residue was taken up in diethyl ether (500 ml), and the solution was filtered. The filtrate was washed with 0.5 N aqueous sodium hydroxide (100 ml) then twice with water (250 ml each portion), and dried over anhydrous magnesium sulphate. On filtration and evaporation there was obtained approximately 56 g of the mixed isomers of formula

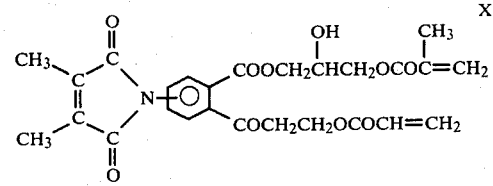

XXX

3-(Methacryloyloxy)-2-hydroxypropyl X,Y-dibromo-p-cresyl ether

To 250 g of commercially-available, X,Y-dibromo-p-cresyl glycidyl ether (epoxide content 2.76 equiv./kg., calculated value 3.11) were added 2,6-di-tert.butyl-p-cresol (0.5 g) and 1 g of tetramethylammonium chloride, and the solution was heated to 100° C. with stirring. Methacrylic acid (59.3 g) was added slowly over 1 hour at a rate such that the temperature of the mixture did not exceed 105° C. Heating at 100° C. was continued until the epoxide content had fallen to a negligibly low value. The product was a clear viscous liquid.

Mixed 3-(methacryloyloxy)-2-hydroxypropyl cresyl ethers

This mixture was prepared similarly, from mixed o-, m-, and p-cresyl glycidyl ethers.

Preparation of n-(p-(acryloylamino)phenyl)-2,3-dimethylmaleimide

Acryloyl chloride (27.2 g) is added to a stirred solution of N-(p-aminophenyl)-2,3-dimethylmaleimide (21.6 g) in pyridene (300 ml) cooled in acetone-solid carbon dioxide at a rate so as to maintain the temperature at 5° to 10° C. The solution is allowed to warm to room temperature, stirred for 2 hours, and then added to a large excess of ice. Concentrated hydrochloric acid is added to the cold mixture at minus 10° C. To remove the excess of pyridine as its hydrochloride the solution is thoroughly extracted into dichloromethane. On evaporation of the solvent there was obtained 9.5 g of the desired amide-imide.

EXAMPLE 1

A composition comprising 45 parts of N-(2-(methacryloyloxy)ethyl)-2,3-dimethylmaleimide, 45 parts of mixed 3-(methacryloyloxy)-2-hydroxypropyl cresyl ethers, 8 parts of benzil dimethyl ketal, and 2 parts of 2-chlorothioxanthone was prepared by heating the methacrylates together at about 50° C. and then stirring in the photoinitiator and the photosensitiser to dissolve them. This composition, which had a viscosity of about 0.25 Pa s, was applied by a spin coater as a layer approximately 20 μm thick onto copper plate. The coating was irradiated for 15 seconds with a medium pressure mercury lamp (80 w per cm) at a distance of 20 cm, and the coating became nontacky.

Next, the coating was irradiated through a negative at a distance of 25 cm from a medium pressure mercury lamp (30 w per cm) for 10 minutes, followed by development with cyclohexanone. A good relief image was obtained.

EXAMPLE 2

The procedure of Example 1 was repeated, using a composition which had a viscosity of about 0.3 Pa s and comprised 25 parts of N-(2-(methacryloyloxy)ethyl)-2,3-dimethylmaleimide, 56 parts of 3-(methacryloyloxy)-2-hydroxypropyl X,Y-dibromo-p-cresyl ether, 11 parts of glycidyl methacrylate, 7 parts of benzil dimethyl ketal, and 2 parts of 2-chlorothioxanthone. The coating was irradiated for 10 seconds in the first stage and for 15 minutes in the second stage. The image was developed in a mixture of equal parts by volume of 1,1,1-trichloroethane and cyclohexanone with agitation and brushing. A good relief image was obtained.

EXAMPLE 3

The procedure of Example 1 was repeated, using a composition which comprised 41.7 parts of N-(2-(methacryloyloxy)ethyl)-2,3-dimethylmaleimide, 41.7 parts of 3-(methacryloyloxy)-2-hydroxypropyl X,Y-dibromo-p-cresyl ether, 10 parts of glycidyl methacrylate, 5 parts of benzil dimethyl ketal, and 1.5 parts of 2-chlorothioxanthone. The coating, which was 15 μm thick, was irradiated at a distance of 3 cm for 15 seconds in the first stage and, at a distance of 25 cm., for 45 seconds in the next stage, with a metal halide lamp of 5000 watts. On development with benzyl alcohol a good image was obtained.

EXAMPLE 4

The procedure of Example 1 was repeated, using a composition which comprised 30 parts of N-(2-(2-(methacryloyloxy)ethoxy)ethyl)-2,3-dimethylmaleimide, 50 parts of 3-(methacryloyloxy)-2-hydroxypropyl, X,Y-dibromo-p-cresyl ether, 20 parts of glycidyl methacrylate, 4 parts of benzil dimethyl ketal, and 2 parts of 2-chlorothioxanthone, applied as a coating 4 μm thick. The coating became nontacky on irradiation for 10 seconds in the first stage.

EXAMPLE 5

A mixture comprising 40 parts of 2-(acryloyloxy)ethyl 3-(methacryloyloxy)-2-hydroxypropyl X-(2,3-dimethylmaleimido)phthalates, 2.4 parts of benzil dimethyl ketal, 1.2 parts of 2-chlorothioxanthone, and 10 parts of glycidyl methacrylate, in the form of a coating on a copper plate, was irradiated for 40 seconds with a medium pressure mercury lamp (80 w per cm) at a distance of 20 cm, a non-tacky coating being obtained. On irradiation at a distance of 25 cm for 15 minutes with a medium pressure mercury lamp (30 w per cm) followed by development with acetone-toluene (1:9 by volume) an image was obtained.

EXAMPLE 6

In this Example the formulation contains a dye so that the image could be clearly seen.

A mixture containing 30 parts of N-(2-(acryloyloxy)ethyl)-2,3-dimethylmaleimide, 60 parts of 3-(methacryloyloxy)-2-hydroxypropyl X,Y-dibromo-p-cresyl ether, 7.5 parts of benzil dimethyl ketal, 1.7 parts of 2-chlorothioxanthone, and 0.6 part of the methacrylate-containing dye of formula

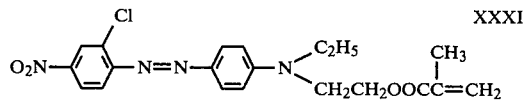
XXXI was applied to copper plate and irradiated under the same conditions as employed in Example 1 except that the first period of irradiation was reduced to 7 seconds and that a mixture of 1,1,1-trichloroethane and cyclohexanone (2:1 by volume) was used for development. A goof relief image was obtained.

EXAMPLE 7

The procedure of Example 6 was repeated, the N-(2-(acryloyloxy)ethyl)-2,3-dimethylmaleimide being replaced by an equal weight of N-(2-(methacryloyloxy)ethyl)-2,3-dimethylmaleimide with similar results.

EXAMPLE 8

In this Example the formulation contains methacrylic acid, so that the image may be developed by means of an aqueous basic solution.

A composition comprising 23 parts of N-(2-(acryloyloxy)ethyl)-2,3-dimethylmaleimide, 23 parts of methacrylic acid, 46 parts of 3-(methacryloyloxy)-2-hydroxypropyl X,Y-dibromo-p-cresyl ether, 6 parts of benzil dimethyl ketal, and 2 parts of 2-chlorothioxanthone was irradiated as described in Example 2, followed by development with 0.1 M aqueous sodium hydroxide. A good relief image was obtained.

EXAMPLE 9

In this Example the formulation contains 2-(diethylamino)ethyl acrylate so that the image may be developed by means of an aqueous acidic solution.

A composition comprising 30 parts of N-(2-(2-(methacryloyloxy)ethoxy)ethyl)-2,3-dimethylmaleimide, 20 parts of 3-(methacryloyloxy)-2-hydroxypropyl X,Y-dibromo-p-cresyl ether, 50 parts of 2-(diethylamino)ethyl acrylate, 3 parts of benzil dimethyl ketal, and 1.5 parts of 2-chlorothioxanthone was applied as a coating 4 μm thick onto copper plate. The coating was irradiated for 10 seconds with a medium pressure mercury lamp (80 w per cm) at a distance of 20 cm, and it became nontacky. After the coating had been irradiated through a negative with a medium pressure mercury lamp (30 w per cm) at a distance of 25 cm for 20 minutes the image was developed by means of 1 M hydrochloric acid.

EXAMPLE 10

In this Example the composition contains a latent curing agent for epoxide resins so that the developed image could be heat-cured.

A mixture, having a viscosity of approximately 0.3 Pa s and comprising 25 parts of N-(2-(methacryloyloxy)ethyl-2,3-dimethylmaleimide, 52 parts of 3-(methacryloyloxy)-2-hydroxypropyl X,Y-dibromo-p-cresyl ether, 12 parts of glycidyl acrylate, 6 parts of benzil dimethyl ketal, 2 parts of 2-chlorothioxanthone, and 3 parts of 2,6-xylidene biguanide was applied to a copper plate as described in Example 1 and then irradiated under the two sets of conditions described in that Example. After development with cyclohexanone the plate was heated at 170° C. for 1 hour to heat-cure the product through its epoxide groups.

EXAMPLE 11

A mixture comprising 50 parts of n-[p-(acryloylamino)phenyl]-2,3-dimethylmaleimide, 100 parts of glycidyl acrylate, 6 parts of benzil dimethyl ketal, and 3 parts of 2-chlorothioxanthone was applied as in example 1 except that the layer was irradiated for 60 seconds in the first stage and for 30 minutes in the second stage. On development with 1,1,1-trichloroethane with brushing an image was obtained.

COMPARATIVE EXAMPLE

For purposes of comparison only, a composition was prepared containing 60 parts of N-(3-hydroxypropyl)-2,3-dimethylmaleimide. 64 parts of 3-(methacryloyloxy)-2-hydroxypropyl, X,Y-dibromo-p-cresyl ether, 10 parts of 2-hydroxyethyl methacrylate, 10 parts of benzil dimethyl ketal, and 5 parts of 2-chlorthioxanthone. This composition was applied as a coating 10 μm thick to a copper-clad epoxide resin-glass fibre laminate and irradiated with a medium pressure mercury lamp (80 w per cm) for 25 seconds, a tack-free film being obtained. However, subsequent irradiation with a medium pressure mercury lamp (30 w/cm) through a photographic negative for 20 minutes did not lead to further crosslinking, since the whole film dissolved when it was immersed in cyclohexanone.

What is claimed is:

1. A process for production of an image which comprises
   (1) exposing to actinic radiation a layer, supported on a carrier, of a liquid composition containing a photoinitiator, a triplet photosensitizer and a compound (A) having in the same molecule both at least one group of formula

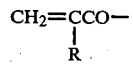
I and at least one group of formula

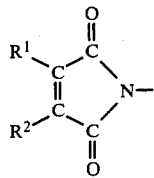
II such that the layer solidifies and becomes essentially nontacky due to photopolymerisation of (A) through the group or groups of formula I but remains substantially photocrosslinkable, and subsequently, (2) exposing the layer so solidified through an image-bearing transparency consisting of substantially opaque and substantially transparent parts to a substantially greater amount of actinic radiation such that the further exposed part or parts of the photopolymerised layer undergo photocrosslinking through the group or groups of formula II, and (3) developing the image by dissolving in a solvent the part or parts of the layer which have not become photocrosslinked, where R denotes a hydrogen atom or a methyl group and $R^1$ and $R^2$ each denote the same or different alkyl group of 1 to 4 carbon atoms or together they denote a trimethylene or tetramethylene group which may be optionally substituted by a methyl group.

2. The process of claim 1 in which (A) contains, per average molecule, up to four groups of formula I.

3. The process of claim 1 in which (A) contains, per average molecule, up to four groups of formula II.

4. The process of claim 1 in which a group of formula I is directly attached to an atom of carbon, oxygen, or nitrogen.

5. The process of claim 1 in which a group of formula II is directly attached to an atom of carbon, oxygen, or nitrogen.

6. The process of claim 1 in which (A) is of the formula pound containing at least one said amino group and at least one carboxyl group,
and $R^4$ denotes the residue, after removal of (a+b) glycidyl groups directly attached to atoms of oxygen, nitrogen, or sulfur, of a compound containing at least (a+b) such glycidyl groups.

7. The process of claim 1 in which (A) is of the formula

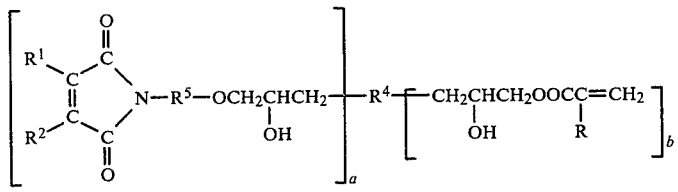
VIII where a and b are each independently an integer of at least 1, $R^4$ denotes the residue, after removal of (a+b) glycidyl groups directly attached to atoms of oxygen, nitrogen, or sulfur, of a compound containing at least (a+b) such glycidyl groups, and $R^5$ denotes the divalent residue, after removal of a primary amino group and a phenolic hydroxyl group, of a compound containing at least one said amino group and at least one said hydroxyl group.

8. The process of claim 1 in which (A) is of the formula

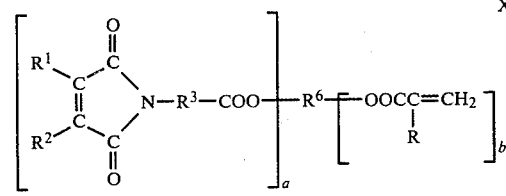
XI where a and b are each independently an integer of at least 1, $R^3$ denotes a divalent residue, after removal of a primary amino group and a carboxyl group, of a compound containing at least one said amino group and at least one said carboxyl group, and $R^6$ denotes the residue, after removal of (a+b) alcoholic hydroxyl groups, of an alcohol having at least (a+b) said hydroxyl groups.

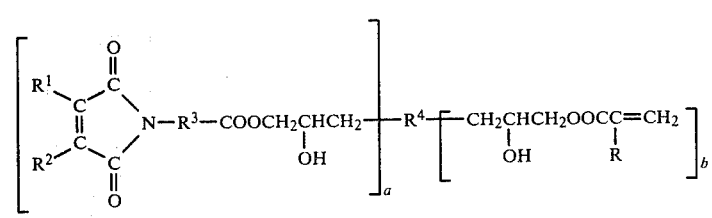
IV where a and b are each independently an integer of at least 1, $R^3$ denotes a divalent residue, after removal of a primary amino group and a carboxyl group, of a com- 9. The process of claim 1 in which (A) is of the general formula

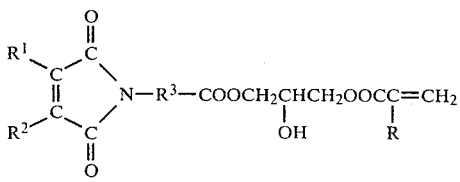
XIV where R³ denotes a divalent residue, after removal of a primary amino group and a carboxyl group, of a compound containing at least one said amino group and at least one carboxyl group.

10. The process of claim 1 in which (A) is of the general formula

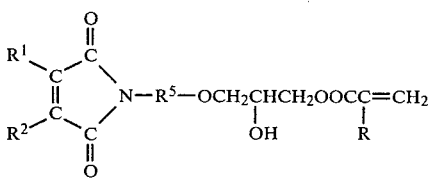
XV where R⁵ denotes the divalent residue, after removal of a primary amino group and a phenolic hydroxyl group, of a compound containing at least one said amino group and at least one said hydroxyl group.

11. The process of claim 1 in which (A) is of the general formula

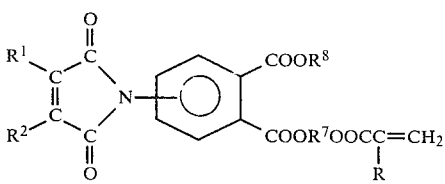
XVII where
R⁷ denotes an alkylene group of 2 to 3 carbon atoms and
R⁸ denotes a hydrogen atom or a group of formula

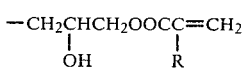
XVIII

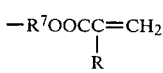
XIX

12. The process of claim 1 in which (A) is of the general formula

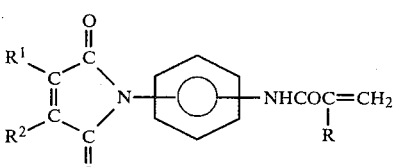
XX or

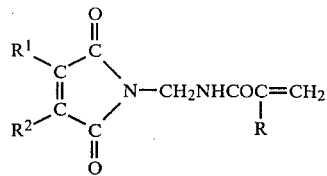
XXI

13. The process of claim 1 in which (A) is of the general formula

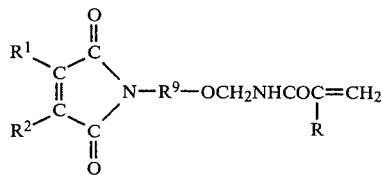
XXII where R⁹ denotes the divalent residue, after removal of a primary amino group and an alcoholic hydroxyl group, of a compound containing at least one said amino group and at least one said hydroxyl group.

14. The process of claim 1 in which (A) is of the general formula

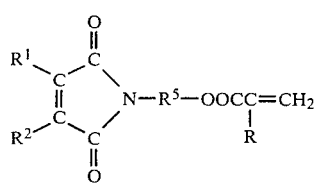
XXIV where R⁵ denotes the divalent residue, after removal of a primary amino group and a phenolic hydroxyl group, of a compound containing at least one said amino group and at least one said hydroxyl group.

15. The process of claim 1 in which (A) is of the general formula

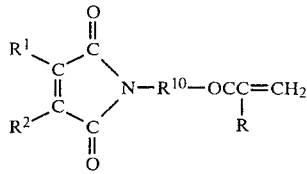
XXV where R¹⁰ denotes an imino group, an alkyleneoxy group of 1 to 10 carbon atoms, a 2-hydroxypropyleneoxy group, a poly(oxyalkylene) group of 4 to 12 carbon atoms, a cycloalkenoxy group of 5 to 7 carbon atoms, or an alkylenecarbonamido group of 2 to 10 carbon atoms.

16. The process of claim 1 in which R¹ and R² each denote a methyl group.

17. The process of claim 1 in which (A) is N-(2-acryloyloxy)ethyl-2,3-dimethylmaleimide, N-(3-(acryloyloxy)-2-hydroxypropyl)-2,3-dimethylmaleimide, N-(3-(acryloyloxy)propyl)-2,3-dimethylmaleimide, N-(2-(methacryloyloxy)ethyl)-2,3-dimethylmaleimide, N-(3-(methacryloyloxy)-2-hydroxypropyl)-2,3-dimethylmaleimide, N-(3-(methacryloyloxy)propyl)-2,3-dimethylmaleimide, or N-(2-(2-methacryloyloxy)ethoxy)ethyl)-2,3-dimethylmaleimide.

18. The process of claim 1 in which the composition contains as (A) a compound of formula

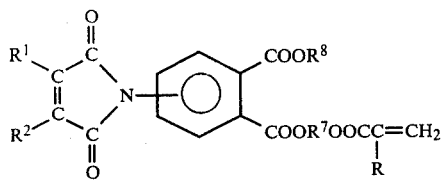

XVII where

R⁸ denotes a hydrogen atom, and the solvent employed for development is an aqueous solution of a base.

19. The process of claim 1 in which the composition further contains a photopolymerisable compound (B) having in the molecule at least one group of formula I but none of formula II and also at least one free sulfonic, phosphonic, or carboxylic acid group, and the solvent employed for development is an aqueous solution of a base.

20. The process of claim 1 in which the composition further contains a photopolymerisable compound (B) having in the molecule at least one group of formula I but none of formula II and also at least one primary, secondary, or tertiary amino group, and the solvent employed for development is an aqueous solution of an acid.

* * * * *